(12) United States Patent  (10) Patent No.: US 8,478,574 B2
Baumgartner et al.  (45) Date of Patent: Jul. 2, 2013

(54) TRACKING ARRAY DATA CONTENTS ACROSS THREE-VALUED READ AND WRITE OPERATIONS

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 557 days.

(21) Appl. No.: 12/771,479

(22) Filed: Apr. 30, 2010

(65) Prior Publication Data

US 2011/0270597 A1  Nov. 3, 2011

(51) Int. Cl.
*G06F 17/50* (2006.01)
(52) U.S. Cl.
USPC .................. 703/14; 703/13; 703/15; 703/16; 703/17; 716/106; 716/103; 716/132; 716/107; 714/733; 365/201
(58) Field of Classification Search
USPC .................. 703/14, 15, 16, 22, 13; 716/116
See application file for complete search history.

(56) References Cited

U.S. PATENT DOCUMENTS

| | | | |
|---|---|---|---|
| 5,255,239 A | 10/1993 | Taborn et al. | |
| 5,377,123 A | 12/1994 | Hyman | |
| 5,644,498 A | 7/1997 | Joly et al. | |
| 5,708,612 A | 1/1998 | Abe | |
| 5,748,527 A | 5/1998 | Lee et al. | |
| 5,818,726 A | 10/1998 | Lee | |
| 5,918,035 A | 6/1999 | Van Praet et al. | |
| 5,953,283 A | 9/1999 | Meltzer et al. | |
| 6,356,485 B1 | 3/2002 | Proebsting | |
| 6,374,205 B1 | 4/2002 | Kuribayashi et al. | |
| 6,374,390 B1 | 4/2002 | Quarles et al. | |
| 6,378,112 B1 | 4/2002 | Martin et al. | |
| 6,425,116 B1 | 7/2002 | Duboc et al. | |
| 6,449,747 B2 | 9/2002 | Wuytack et al. | |

(Continued)

FOREIGN PATENT DOCUMENTS

| | | |
|---|---|---|
| EP | 1770495 A1 | 4/2007 |
| JP | 06162139 A2 | 6/1994 |
| JP | 09035497 A | 2/1997 |
| JP | 2008541331 | 11/2008 |

OTHER PUBLICATIONS

Notice of Allowance mailed Jan. 12, 2012 for U.S. Appl. No. 12/771,613, 11 pp.

(Continued)

*Primary Examiner* — Saif Alhija
*Assistant Examiner* — Cuong Luu
(74) *Attorney, Agent, or Firm* — Stephen R. Tkacs; Stephen J. Walder, Jr.; Libby Z. Toub

(57) ABSTRACT

A mechanism is provided in an integrated circuit simulator for tracking array data contents across three-value read and write operations. The mechanism accounts for write operations with data values and address values having X symbols. The mechanism performs writes to a tree data structure that is used to store the three-valued contents to the array. The simulator includes functionality for updating the array contents for a three-valued write and to read data for a three-valued read. The simulator also includes optimizations for dynamically reducing the size of the data structure when possible in order to save memory in the logic simulator.

19 Claims, 11 Drawing Sheets

U.S. PATENT DOCUMENTS

| | | | |
|---|---|---|---|
| 6,532,440 | B1 | 3/2003 | Boppana et al. |
| 6,571,204 | B1 * | 5/2003 | Meyer .............................. 703/22 |
| 6,611,952 | B1 | 8/2003 | Prakash et al. |
| 6,636,939 | B1 | 10/2003 | George |
| 6,654,849 | B1 | 11/2003 | Brockman et al. |
| 6,698,003 | B2 | 2/2004 | Baumgartner et al. |
| 6,717,884 | B2 | 4/2004 | Kim |
| 6,748,573 | B2 | 6/2004 | Baumgartner et al. |
| 6,763,505 | B2 | 7/2004 | Baumgartner et al. |
| 6,847,927 | B2 | 1/2005 | Hoffman et al. |
| 7,006,370 | B1 | 2/2006 | Ramesh et al. |
| 7,069,523 | B2 | 6/2006 | Nation et al. |
| 7,194,724 | B2 | 3/2007 | Hattori et al. |
| 7,260,799 | B2 | 8/2007 | Baumgartner et al. |
| 7,290,228 | B2 | 10/2007 | Guenther et al. |
| 7,299,432 | B2 | 11/2007 | Baumgartner et al. |
| 7,340,577 | B1 | 3/2008 | Van Dyke et al. |
| 7,367,002 | B2 | 4/2008 | Baumgartner et al. |
| 7,386,818 | B2 | 6/2008 | Ganai et al. |
| 7,398,484 | B2 | 7/2008 | Ruf |
| 7,448,005 | B2 | 11/2008 | Baumgartner et al. |
| 7,506,297 | B2 | 3/2009 | Mukherjee et al. |
| 7,512,925 | B2 | 3/2009 | Birmiwal et al. |
| 7,523,380 | B1 | 4/2009 | Trimberger |
| 7,778,812 | B2 * | 8/2010 | Hoffman, Jr. ................... 703/14 |
| 7,934,180 | B2 | 4/2011 | Baumgartner et al. |
| 7,962,880 | B2 | 6/2011 | Lipetz et al. |
| 8,001,498 | B2 | 8/2011 | Bjesse |
| 8,146,034 | B2 | 3/2012 | Baumgartner et al. |
| 2001/0052106 | A1 | 12/2001 | Wuytack et al. |
| 2003/0065965 | A1 | 4/2003 | Korobkov |
| 2003/0123319 | A1 | 7/2003 | Kim |
| 2004/0039893 | A1 | 2/2004 | Lyon |
| 2004/0117744 | A1 | 6/2004 | Nation et al. |
| 2005/0091475 | A1 | 4/2005 | Sodani |
| 2006/0136849 | A1 | 6/2006 | Greenberg et al. |
| 2006/0156269 | A1 * | 7/2006 | Hoffman, Jr. ................... 716/19 |
| 2007/0067746 | A1 | 3/2007 | Baumgartner et al. |
| 2007/0121499 | A1 | 5/2007 | Pal et al. |
| 2008/0066034 | A1 | 3/2008 | Baumgartner et al. |
| 2008/0120085 | A1 | 5/2008 | Alexanian et al. |
| 2008/0134114 | A1 | 6/2008 | Bjesse et al. |
| 2008/0144421 | A1 | 6/2008 | Deng et al. |
| 2009/0013301 | A1 | 1/2009 | Ogilvie et al. |
| 2009/0119428 | A1 | 5/2009 | Chow et al. |
| 2009/0144674 | A1 | 6/2009 | Koithyar et al. |
| 2009/0190386 | A1 | 7/2009 | Kim |
| 2009/0228848 | A1 | 9/2009 | Kumazaki |
| 2010/0020605 | A1 | 1/2010 | Aritome |
| 2010/0097837 | A1 | 4/2010 | Paul |
| 2010/0107132 | A1 | 4/2010 | Bjesse |
| 2010/0293513 | A1 | 11/2010 | Baumgartner et al. |
| 2011/0066578 | A1 | 3/2011 | Chong et al. |
| 2011/0145780 | A1 | 6/2011 | Chen |
| 2011/0271242 | A1 | 11/2011 | Baumgartner et al. |
| 2011/0271243 | A1 | 11/2011 | Baumgartner et al. |
| 2011/0271244 | A1 | 11/2011 | Baumgartner et al. |
| 2011/0276930 | A1 | 11/2011 | Baumgartner et al. |
| 2011/0276931 | A1 | 11/2011 | Baumgartner et al. |
| 2011/0276932 | A1 | 11/2011 | Baumgartner et al. |
| 2011/0307663 | A1 | 12/2011 | Kultursay et al. |
| 2012/0179806 | A1 | 7/2012 | Torii |

OTHER PUBLICATIONS

Notice of Allowance mailed Nov. 29, 2011 for U.S. Appl. No. 12/771,677, 11 pp.

Office Action mailed Oct. 24, 2011 for U.S. Appl. No. 12/775,633, 15 pp.

Office Action mailed Dec. 9, 2011 for U.S. Appl. No. 12/775,622, 11 pp.

Notice of Allowance mailed Feb. 28, 2012 for U.S. Appl. No. 12/775,633, 7 pages.

Notice of Allowance mailed Mar. 26, 2012 for U.S. Appl. No. 12/775,622, 12 pages.

Office Action mailed Jan. 23, 2012 for U.S. Appl. No. 12/771,404, 9 pp.

Office Action mailed Mar. 8, 2012 for U.S. Appl. No. 12/775,607, 18 pages.

Response to Office Action filed with the USPTO on Jan. 24, 2012 for U.S. Appl. No. 12/775,633, 11 pages.

Response to Office Action filed with the USPTO on Mar. 9, 2012 for U.S. Appl. No. 12/775,622, 15 pages.

Response to Office Action filed with the USPTO on Apr. 18, 2012 for U.S. Appl. No. 12/771,404, 12 pages.

Bardell, PH et al., "Random Pattern Testability of the Logic Surrounding Memory Arrays", IBM technical Disclosure Bulletin, IPCOM000039582D, Jul. 1987, pp. 521-528.

Baumgartner, J et al., "Maximal Input Reduction of Sequential Netlists via Synergistic Reparameterization and Localization Strategies", Correct Hardware Design and Verification Methods, 13th IFIP WG 10.5 Advanced Research Working Conference, CHARME 2005, Proceedings 3-6, Saarbrucken, Germany, Oct. 2005, 1 page.

Burch, Jerry R. et al., "Automatic Verification of Pipelined Microprocessor Control", Lecture Notes in Computer Science, vol. 818, Proceedings of the 6th International Conference on Computer Aided Verification, Year of Publication: 1994, pp. 68-80.

Pandey, M et al., "Formal Verification of Memory Arrays Using Symbolic Trajectory Evaluation", IEEE International Workshop on Memory Technology, Design and Testing (MTDT 1997), pp. 42.

Ray, Sandip et al., "Abstracting and Verifying Flash Memories", http://userweb.cs.utexas.edu/~sandip/publications/flash-nvm-08/flash,pdf, <retrieved on Mar. 10, 2010>, 5 pages.

Velev, Miroslav et al., "Efficient Modeling of Memory Arrays in Symbolic Simulation", Computer Aided Verification, vol. 1254/1997, Jun. 1997, pp. 388-399.

Notice of Allowance mailed Apr. 23, 2012 for U.S. Appl. No. 12/771,404, 9 pages.

Notice of Allowance mailed Jun. 1, 2012 for U.S. Appl. No. 12/775,633, 6 pages.

Response to Office Action filed with the USPTO on Jun. 8, 2012 for U.S. Appl. No. 12/775,607, 10 pages.

Ganai, Malay K. et al., "Verification of Embedded Memory Systems using Efficient Memory Modeling", Proceedings of the Design, Automation and Test in Europe Conference and Exhibition (DATE'05), vol. 2, 2005, 6 pages.

Mishchenko, Alan et al., "SAT-Based Complete Don't-Care Computation for Network Optimization", Proceedings of the Conference on Design, Automation and Test in Europe (DATE/05), vol. 1, 2005, 8 pages.

USPTO U.S. Appl. No. 12/771,404.
USPTO U.S. Appl. No. 12/771,613.
USPTO U.S. Appl. No. 12/771,677.
USPTO U.S. Appl. No. 12/775,607.
USPTO U.S. Appl. No. 12/775,622.
USPTO U.S. Appl. No. 12/775,633.

Notice of Allowance mailed Jun. 25, 2012 for U.S. Appl. No. 12/775,607, 10 pages.

Notice of Allowance mailed Aug. 3, 2012 for U.S. Appl. No. 12/775,622, 10 pages.

* cited by examiner

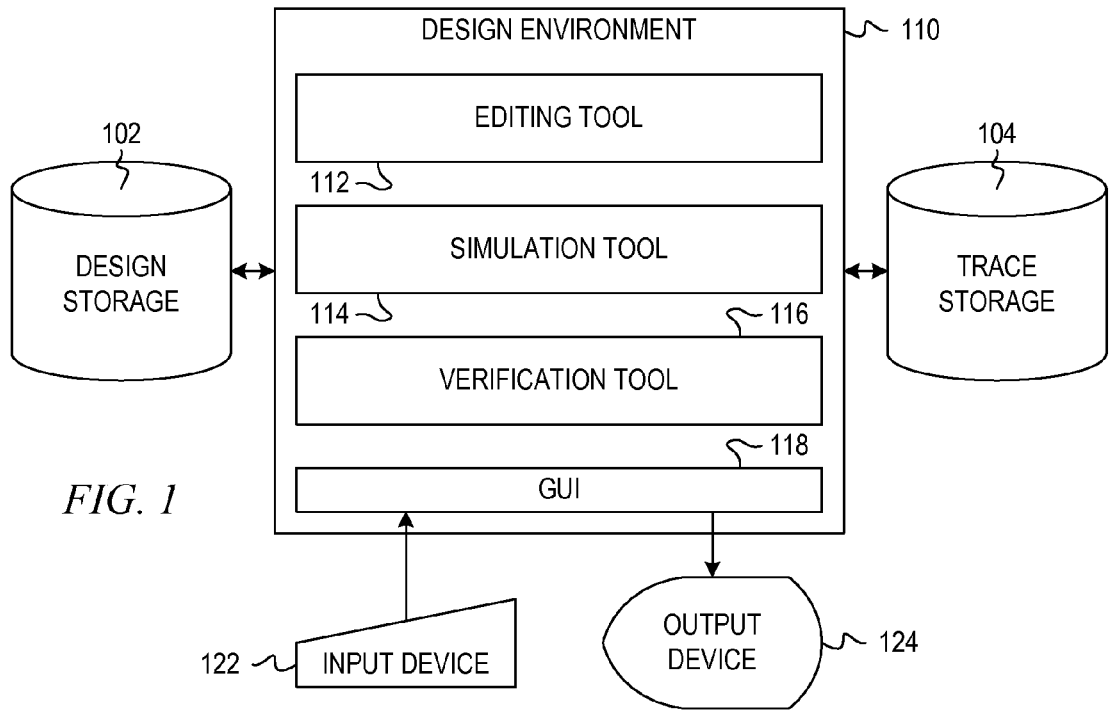
FIG. 1
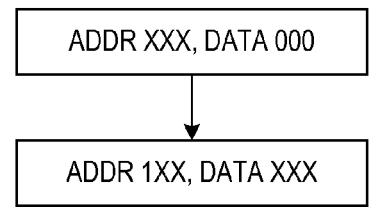
FIG. 2
FIG. 3A
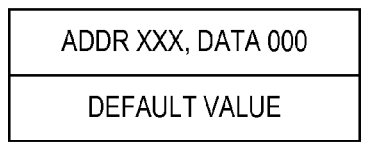
FIG. 3B
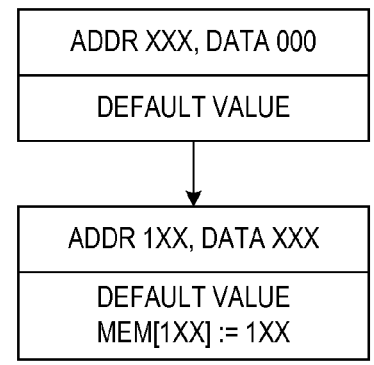

*FIG. 7A*

```
function write(addr, data) {
        writeRecursive(addr, data, treeRoot);
        cleanupTree()
} function writeRecursive(addr, data, location) {
        if (addr == location.addr) {
                updateData(location, data);
        } else {
                addrsToWrite = { addr }
                forall children C of location {
                        forall addrs A in addrsToWrite {
                                intersection = A intersect C.addr
                                if (intersection == null) continue;

writeRecursive(intersection, data, C)

addrsToWrite += enumerate cubes in A – intersection
                                addrsToWrite -= A
                                remove dominated cubes from addrsToWrite
                        }
                } forall addrs A in addrsToWrite {
                        create new child C under location
                        C.addr = A
                        C.data = location.data
                        updateData(C, data)
                }
        }
} function updateData(location, data) {
        if (function write was passed a minterm address) {
                location.data = data
        } else {
                location.data = resolve(location.data, data)
        }
}
```

*FIG. 7B*

```
function cleanupTree() {
        walk the tree: forall relationships (child C, parent P) {
                if (C.data == P.data) {
                        add C's children to P
                        delete C
                }
        }
}
```

*FIG. 9*

```
function read(addr, data) {
        return readRecursive(addr, treeRoot);
} function readRecursive(addr, location) {
        addrsToRead = { addr }
        subReads = {} forall children C of location {
                forall addrs A in addrsToRead {
                        intersection = A intersect C.addr
                        if (intersection == null) continue;

subReads += readRecursive(intersection, C)

addrsToRead += enumerate cubes in A – intersection
                        addrsToRead -= A
                        remove dominated cubes from addrsToRead
                }
        } if (addrsToRead not empty) {
                subReads += location.data
        } return resolve(all vectors in subReads)
}
```

FIG. 10A

```
vector resolve(A, B) {
        output = empty vector;
        forall bit indices i {
                static const unsigned char lut [3] [3] = {
                        //       0              1              X
                        /* 0 */ { 0,            tern_X,        tern_X },
                        /* 1 */ { tern_X,       1,             tern_X },
                        /* X */ { tern_X,       tern_X,        tern_X }};
                output [i] = lut [ A[i] ] [ B[i] ];
        }
        return output;
}
```

FIG. 10B

```
static void ternVector_resolve(TernVector* A, TernVector* B, TernVector* out, unsigned numWords) {
        unsigned i;
        for (i = 0; i < numWords; ++i) {
                uint64_t aWord = A->words[i];
                uint64_t bWord = B->words[i];

uint64_t aWord_is_0 = ~(aWord >> 1) & ~aWord;   // 2-bit sequence = 00
                uint64_t aWord_is_1 = ~(aWord >> 1) & aWord;    // 2-bit sequence = 01
                uint64_t bWord_is_0 = ~(bWord >> 1) & ~bWord;   // 2-bit sequence = 00
                uint64_t bWord_is_1 = ~(bWord >> 1) & bWord;    // 2-bit sequence = 01 uint64_t out_is_X = ~((aWord_is_0 & bWord_is_0) | (aWord_is_1 & bWord_is_1));
                uint64_t out_is_1 = aWord_is_1 & bWord_is_1;

out->words[i] = ( ((out_is_X << 1) & 0xaaaaaaaaaaaaaaaa11u)
                                | (out_is_1 & 0x5555555555555555511u));
        }
}
```

TRACKING ARRAY DATA CONTENTS ACROSS THREE-VALUED READ AND WRITE OPERATIONS

BACKGROUND

The present application relates generally to an improved data processing apparatus and method and more specifically to mechanisms for tracking array data contents across three-valued read and write operations.

Modern chip designs are complex and often involve arrays, a basic memory block that contains a set of data words. One can characterize an array by the number of bits in the data address and the number of bits in each data word. Arrays support the primitive operations of write (address, data), which is used to update the array contents, and read (address), which is used to fetch data from the array.

Applications, such as simulation and formal verification, often use non-determinism. One may use non-determinism to either make the model more general or to alleviate performance problems. Typically, each signal has a binary value of 0 (zero) or 1 (one). Non-determinism introduces the new symbol, X, which means that the value of a signal is not known. This X symbol represents a non-determined value. This formulation is often called ternary, or three-valued, modeling.

Ternary modeling becomes problematic when a design has arrays. Suppose one performs a read at an address that contains X symbols. This means that certain bits of the address are unknown and could take either the value of 0 or 1. In effect, the address could resolve to one of a set of possible concrete (X-free) addresses, and the number of concrete addresses is equal to $2^N$, where N is the number of bits in the address with an X value. Essentially, this means that one no longer knows which address is being read from. For writes, one may not know the exact write address, and one also may not know the exact value being written.

For designs with arrays, simulators often take lossy shortcuts. For example, a simulator may consider the entire array to have value X if any X appears on any write address, or it may raise an exception if an X appears in the address.

Additionally, a design model includes an enable signal that is paired with each read and write operation. A read enable signal specifies whether the read actually reads from the array or merely returns random values. A write enable signal specifies whether the array should actually be updated. It is possible for X values to appear on enable signals. In the case of an X on a write enable signal, the array contents can be difficult to model. Existing simulators take shortcuts, often settling the entire array contents to X in such cases or raising an exception. While this approximation is sound because the approximated data is a superset of the real data, such a shortcut loses much of the precision.

The raise-exception approach outright precludes the use of performing ternary simulation for many practically useful design and verification tasks. For example, three-valued simulation is often an all-X state. Similarly, numerous pervasive logic verification tasks, such as "fencing logic verification," require ternary simulation to access whether an X value may propagate beyond some logical boundary. Such simulator shortcuts result in very coarse approximations or outright preclude the use of ternary simulators for such applications on designs with memory arrays.

SUMMARY

In one illustrative embodiment, a method, in a data processing system, is provided for tracking array data contents across three-value read and write operations in a simulation of an integrated circuit design. The method comprises receiving, in the data processing system, an integrated circuit design having a memory array and initializing a tree data structure for the memory array having a root node assigning a default non-determined value to all data bits. Responsive to a write operation writing a write data value to a write address, the method updates, by the data processing system, the tree data structure to track memory array contents.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 1 is a block diagram illustrating an example design environment in accordance with an illustrative embodiment;

FIG. 2 is an example of a tree data structure for storing array contents in accordance with an illustrative embodiment;

FIGS. 3A-3H depict example changes of a tree structure storing array contents over a sequence of write calls and operation of how a read call is handled in accordance with an illustrative embodiment;

FIGS. 7A and 7B depict pseudo-code for the operations illustrated in FIGS. 4-6 in accordance with an illustrative embodiment;

FIG. 9 depicts example pseudo-code for performing a read from an address in accordance with an illustrative embodiment;

FIG. 10A depicts example pseudo-code for resolving values in the tree data structure in accordance with an illustrative embodiment;

FIG. 10B depicts example pseudo-code for an optimized resolve implementation;

DETAILED DESCRIPTION

Figure 3C:
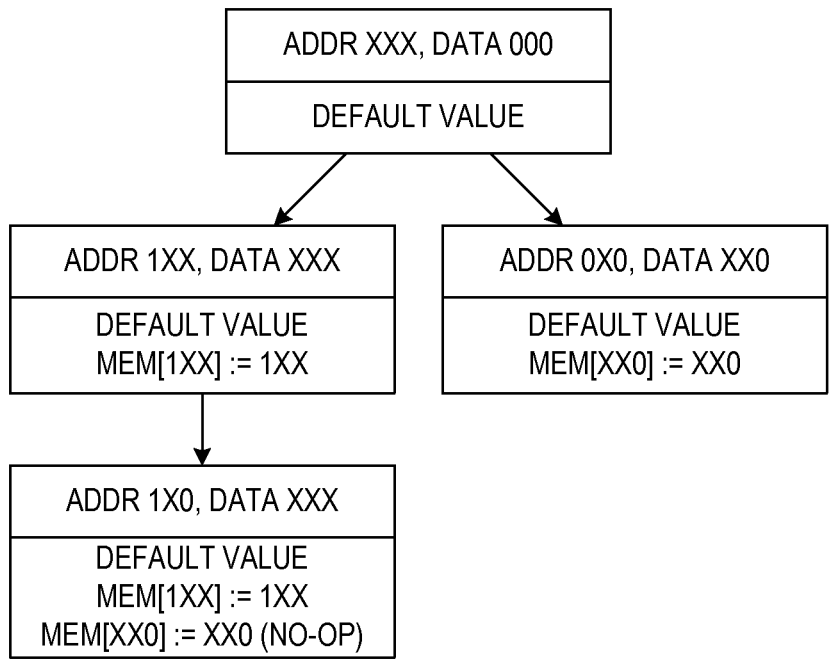

The illustrative embodiments provide a mechanism in a simulator for tracking array data contents across three-value read and write operations. The mechanism accounts for write operations with data values and address values having X symbols. The mechanism performs writes to a tree data structure that is used to store the three-valued contents to the array. The simulator includes functionality for updating the array contents for a three-valued write and to read data for a three-valued read. The simulator also includes optimizations for dynamically reducing the size of the data structure when possible in order to save memory in the logic simulator.

FIG. 1 is a block diagram illustrating an example design environment in accordance with an illustrative embodiment. When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototype control and decision structures in flowchart applications or enter them in a state-diagram editor. The process of writing the HDL description is highly dependent on the nature of the circuit and the designer's preference for coding style.

Design environment 110 may include editing tool 112, simulation tool 114, verification tool 116, and graphical user interface (GUI) 118. A circuit designer may create and edit an integrated circuit (IC) design, which may be written in a high-level HDL, such as VHSIC or Verilog, and store the IC design in design storage 102. The circuit designer may interact with editing tool 112 via graphical user interface (GUI) 118 using input device 122 and output device 124.

Simulation tool 114 simulates operation of an IC circuit from design storage 102. The designer may control simulation tool 114 via GUI 118 using input device 122 and output device 124. Simulation tool 114 stores trace results in trace storage 104. Simulation tool 114 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 114 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 110.

Verification tool 116 allows the designer to verify an IC design from design storage 102. A manufacturer may establish and maintain procedures for verifying an IC design. Design verification confirms that the design output meets the design input requirements. Verification tool 116 compares design outputs to design input requirements to determine whether the requirements have been met. The designer may control verification tool 116 via GUI 118 using input device 122 and output device 124. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

In accordance with an illustrative embodiment, simulation tool 114 tracks array contents in an IC design as precisely as possible while still being sound and efficient enough to operate with acceptable performance overhead on the simulation process. Simulation tool 114 makes precise deductions about the nature of the design from the simulation patterns, deductions that would otherwise be impossible if the patterns were corrupted by lossy shortcuts. Simulation tool 114 uses a data structure and set of techniques that are able to track the contents of an array across a series of ternary read and write operations. These techniques are efficient and track the array contents with the maximum possible precision with minimal runtime cost.

Let write (addr, data) be a function that writes the data string data to the address string addr. Both data and addr may contain X symbols. If addr contains X symbols, then the actual address being written is unknown. Thus, addr is a cube that contains many minterms and any number of these minterms can be the actual address. A minterm (standard product term) is a product (AND) of n Boolean variables. With n variables, such as bits in an address, 2n different minterms are possible. A cube, similar to a minterm, is a product of Boolean variables. Unlike a minterm, a cube may not include all possible variables in the product. The missing variables—or X symbols in this case—can assume any value, and in this way a cube is used to represent a set of minterms. The X symbols in this case arise from approximations made in the simulator. For each minterm m∈addr, let d be the data previously stored at m. After the write, the data at m should be resolve (d, data) where resolve ( ) gives the tightest cube that contains both d and data.

If addr contains no X symbols (addr is a minterm), then the write address is certain. In this case, the value at the minterm addr is overwritten with the new data. Calling resolve ( ) to combine data and the previous value is unnecessarily pessimistic.

Let read (addr) be a function that reads data from address addr, where addr can contain X symbols. For each minterm m∈addr, the returned data cube must contain the value stored at address m. Therefore, a primitive read(addr) implementation would simply call resolve ( ) repeatedly to combine results from all minterms m in addr.

FIG. 2 is an example of a tree data structure for storing array contents in accordance with an illustrative embodiment. The reference model must do some computation for each address minterm. The tree structure of FIG. 2 groups results by address cubes, taking advantage of the fact that similar addresses contain similar data. The tree structure of FIG. 2 stores the array contents into an n-ary tree. Each tree node contains a three-valued address and the three-valued data stored at that address. Edges denote the following relationships:

Each child tree node has an address cube that is contained in the parent's address cube. (For example: X11 ⊆ XX1.)

For each node n in the graph, there does not exist a child of n that is contained in another child of n.

Each node n allows a representation of the three-valued data at an address range, with exceptions indicated by the children of n. For example, the tree in FIG. 2 indicates that address XXX stores data 000, except for the sub-address 1XX that stores data XXX.

As one basic optimization on this data structure, if a child node and parent node have the same data, then the presence of the child does not convey any new information. Therefore, the simulator may remove the child node in this case. If the range of data stored in the array decreases (the design starts writing all-X data, for example), then the simulator may substantially compress the tree.

FIGS. 3A-3H depict example changes of a tree structure storing array contents over a sequence of write calls and operation of how a read call is handled in accordance with an illustrative embodiment. In FIGS. 3A-3H, the address and data of each node are shown (top portion) as well as an illustration of how the data value has been derived (bottom portion). The examples depicted in FIGS. 3A-3H use a 3-bit address and 3-bit data; however, a person of ordinary skill in the art will recognize that the techniques of the illustrative embodiments can accommodate any address or data width without departing from the spirit and scope of the present invention.

As shown in FIG. 3A, the simulator sets the array's default value to be 000. FIG. 3A shows this operation with a single node. Next, as shown in FIG. 3B, the simulator emulates a write of data 1XX to address 1XX. Address 1XX is contained in XXX; therefore, the simulator creates a new node. Because 1XX is not a single address minterm, the simulator resolves the data at this new node with the data at the root. That is, resolve (1XX, 000)=XXX.

Figure 3D:
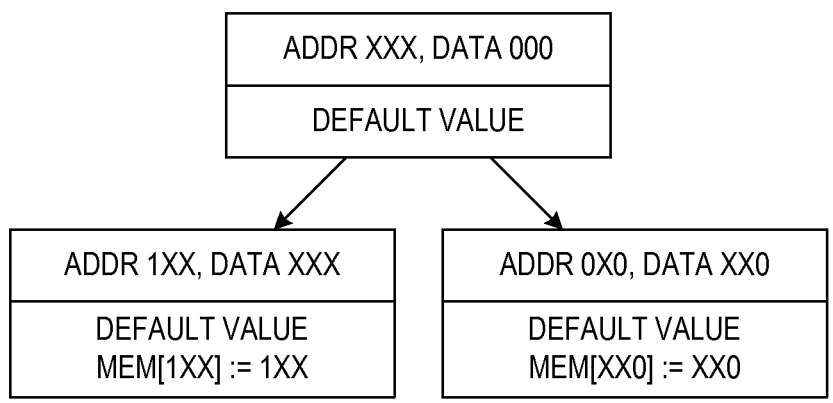

As depicted in FIG. 3C, the simulator emulates a write of data XX0 to address XX0. Note that XX0 overlaps 1XX, and the intersection of these two is recorded as the new node 1X0 under 1XX. The remainder is 0X0, and the simulator writes this remainder under the root. Note that address 1XX and 1X0 store the same data; therefore, the child 1X0 does not convey any information, and the simulator simplifies the tree by removing the node for 1X0, as shown in FIG. 3D.

Figure 3E:
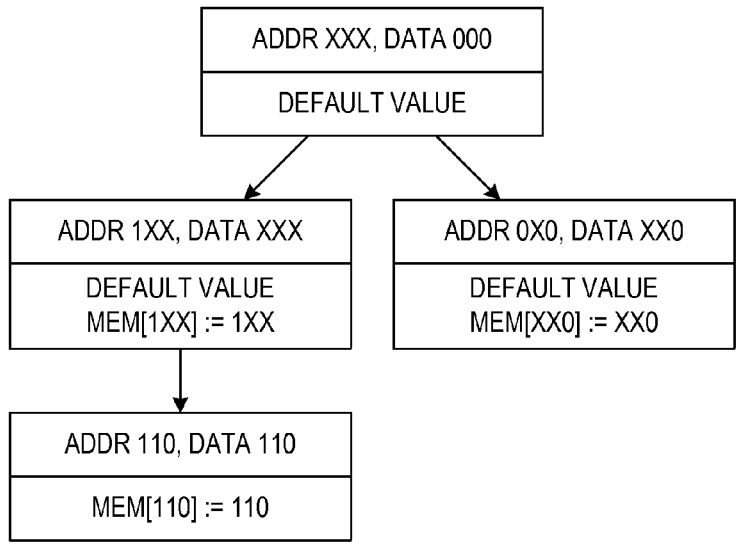

As depicted in FIG. 3E, the simulator emulates a write of data 110 to address 110. Note that this write is to a minterm address; therefore, the simulator need not resolve this new data with the parent data.

Figure 3F:
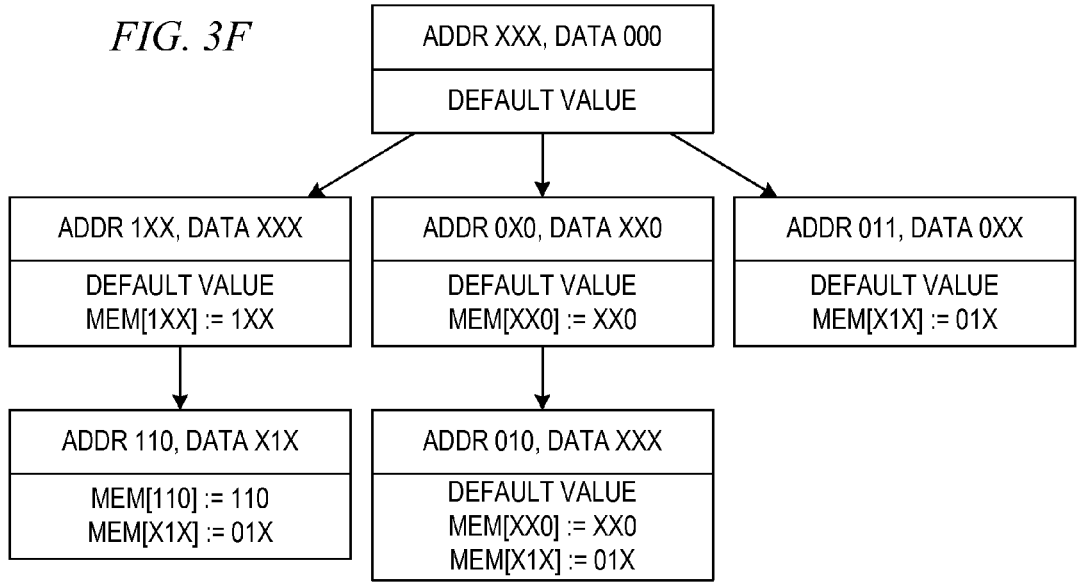

Next, as depicted in FIG. 3F, the simulator emulates a write of data X1X to address X1X. The simulator divides this address into four pieces: 110 (under 1X0), 111 (under 1XX), 010 (under 0X0), and 011 (under XXX). The resulting tree has redundancies; therefore the simulator cleans up the tree by removing two of the four new nodes, as shown in the resulting tree in FIG. 3F.

Figure 3G:
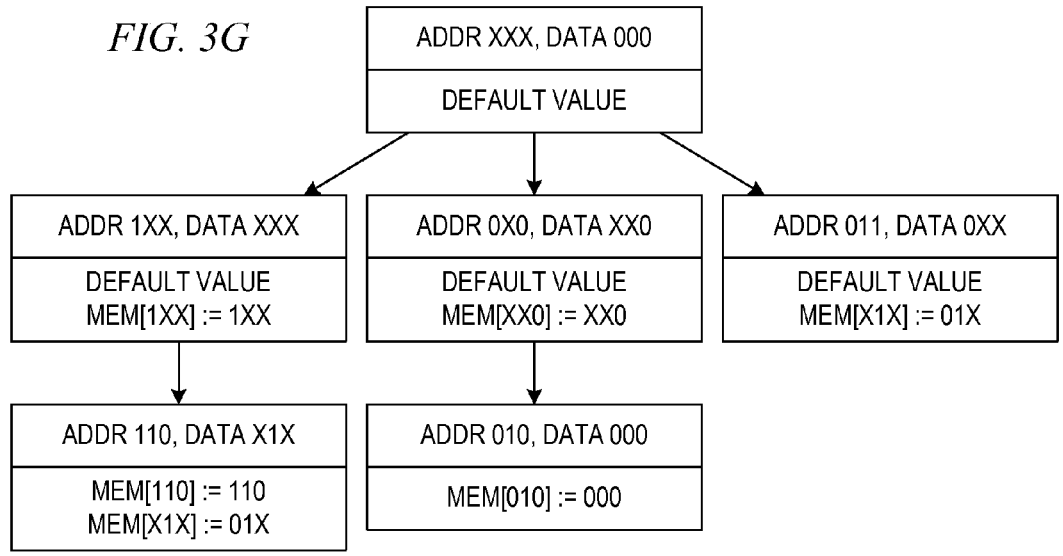

As depicted in FIG. 3G, the simulator emulates a write of data 010 to address 000. Note that the write is to a minterm address; therefore, the simulator need not resolve this new data with what was previously stored at that address. The simulator simply overwrites the previous node.

Figure 3H:
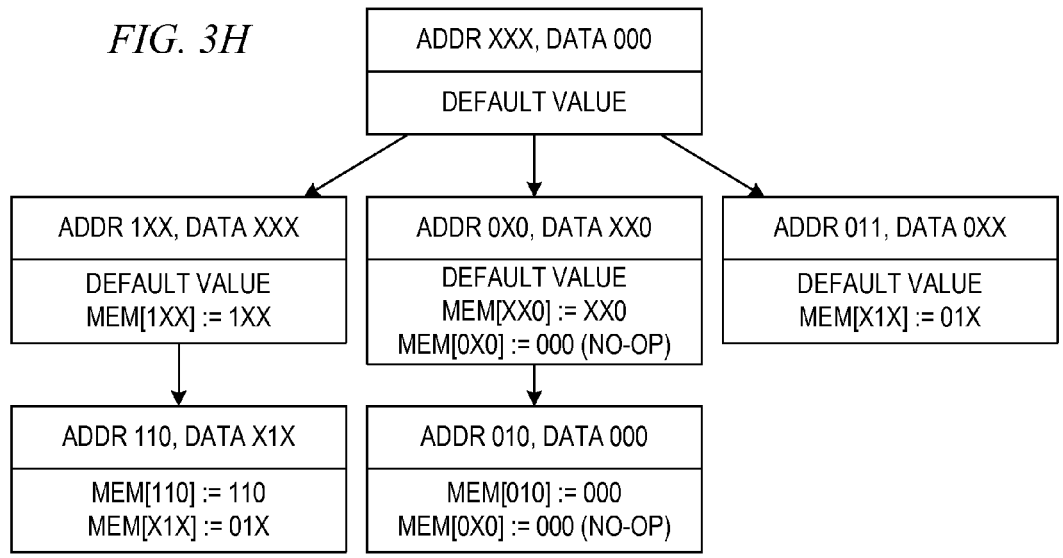

As depicted in FIG. 3H, the simulator emulates a write of data 0X0 to address 000. This write does not change anything represented in the tree data structure, because this write is consistent with data already stored in the tree. However, the representation shown in FIG. 3H depicts the changes to how the data value has been derived by adding no-op instructions to the bottom portion of the nodes for address 0X0 and address 010.

Given the tree data structure depicted in FIG. 3H, consider a read at address 01X. The data for hit address range is stored in two nodes in the tree: address 010 and address 011. Resolving the data at these two addresses produces the result 0XX. Note that the simulator never wrote to address 01X explicitly; however, the technique of the illustrative embodiments is capable of deriving a result that is consistent with all writes.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4:
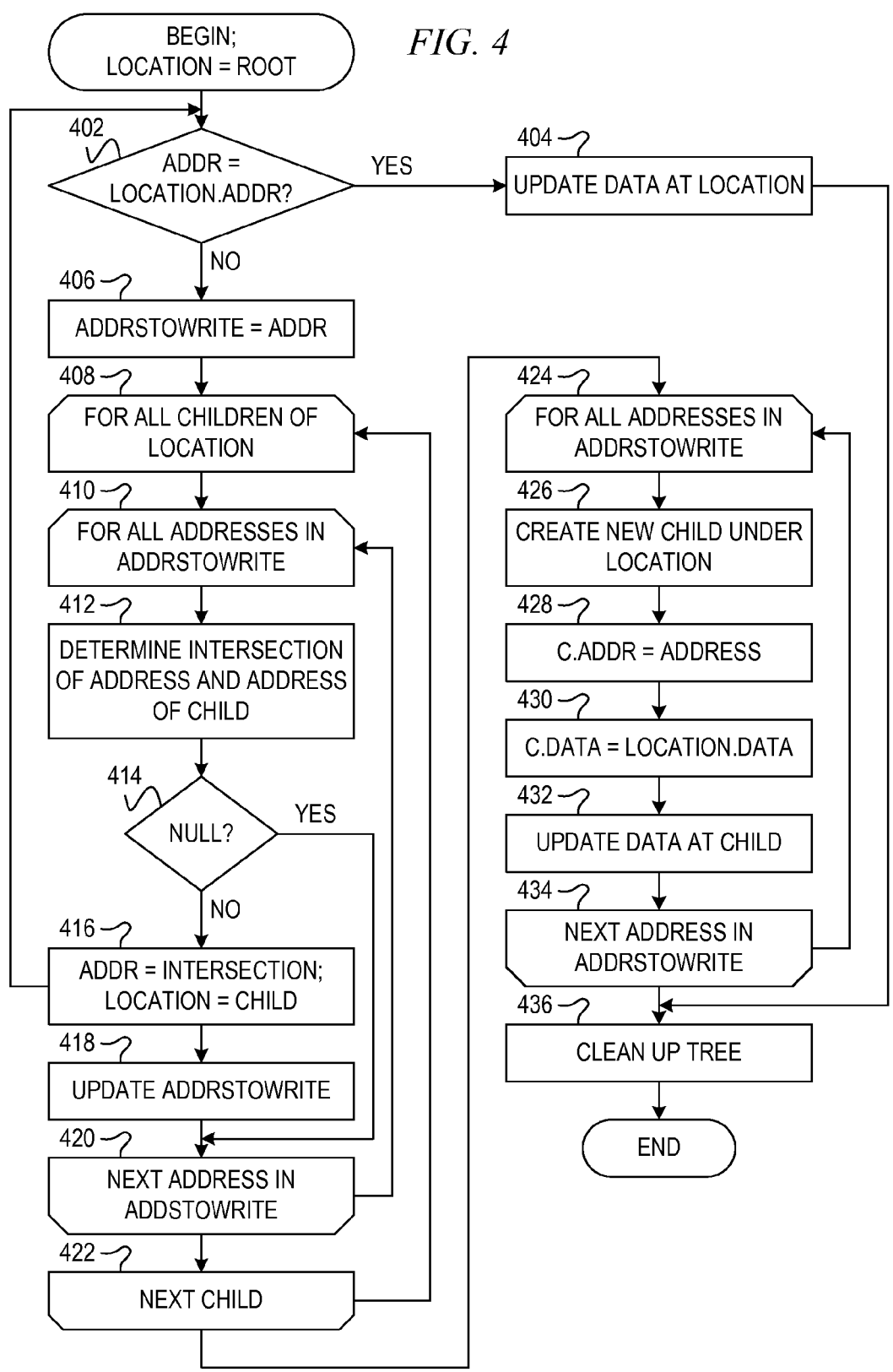
FIG. 4 is a flowchart illustrating operation of a simulation tool for performing a write of data to an address in accordance with an illustrative embodiment.

FIG. 4 is a flowchart illustrating operation of a simulation tool for performing a write of data to an address in accordance with an illustrative embodiment. Operation begins with the current location (node) in the tree equal to the root of the tree. The simulator determines whether the address (addr) is equal to the address of the current node (block 402). If the address of the write operation is equal to the address of the current node, the simulator updates the data at the current node (block 404). The operation of the simulator for updating data for a node is described below with reference to FIG. 5. Thereafter, operation proceeds to block 436 to clean up the tree, and operation ends. The operation of the simulator for cleaning up the tree is described below with reference to FIG. 6.

If the address of the write is not equal to the address of the current node in block 402, the simulator sets addrstowrite equal to addr (block 406). Then, for all children of the current location (block 408) and for all given addresses in addrstowrite (block 410), the simulator determines an intersection of the given address and the address of the child (block 412). Then, the simulator determines whether the intersection is null (block 414). If the intersection is null, the simulator considers the next address in addrstowrite (block 420), and returns to block 410 to repeat the loop for the next address in addrstowrite. Responsive to the simulator considering all addresses in addrstowrite in block 420, the simulator considers the next child of the current location (block 422) and returns to block 408 to repeat the loop for the next child.

If the intersection is not null in block 414, the simulator performs the write operation recursively; therefore, the simulator sets the address (addr) to the intersection and the location to the child node (block 416), and operation proceeds to block 402. Also, the simulator updates addrstowrite (block 418), considers the next address in addrstowrite (block 420), and returns to block 410 to repeat the loop for the next address in addrstowrite. The data at the address contained in the intersection have been written, but addresses within the original address but outside the intersection still need to be written. The simulator enumerates these addresses as extra cubes to be added to addrstowrite, effectively queuing these additional addresses for writing in the future. In this process, the list of cubes addrstowrite can become redundant in that it is possible for one cube in the list to be dominated by another. In this case, "dominated" means that the first cube is wholly contained in the second cube. Writing to a smaller address cube and then writing to a larger, subsuming address is inefficient because this operation updates data at the smaller address cube twice. For this reason, it is necessary to traverse addrstowrite and remove dominated cubes. Responsive to the simulator considering all addresses in addrstowrite in block 420, the simulator considers the next child of the current location (block 422) and returns to block 408 to repeat the loop for the next child.

Responsive to the simulator considering the last child of the current location in block 422, for all given addresses in addrstowrite (block 424), the simulator creates a new child under the current location (block 426), sets the address of the child (C.addr) to the given address (block 428), sets the data for the child (C.data) to the data of the current location (location.data) (block 430), and updates the data at the child (block 432). The operation of the simulator for updating data for a node is described below with reference to FIG. 5. The simulator then considers the next address in addrstowrite (block 434) and returns to block 424 to repeat the loop for the next address. Responsive to the simulator considering the last address in addrstowrite in block 434, the simulator cleans up the tree (block 436), and operation ends. The operation of the simulator for cleaning up the tree is described below with reference to FIG. 6.

Figure 5:
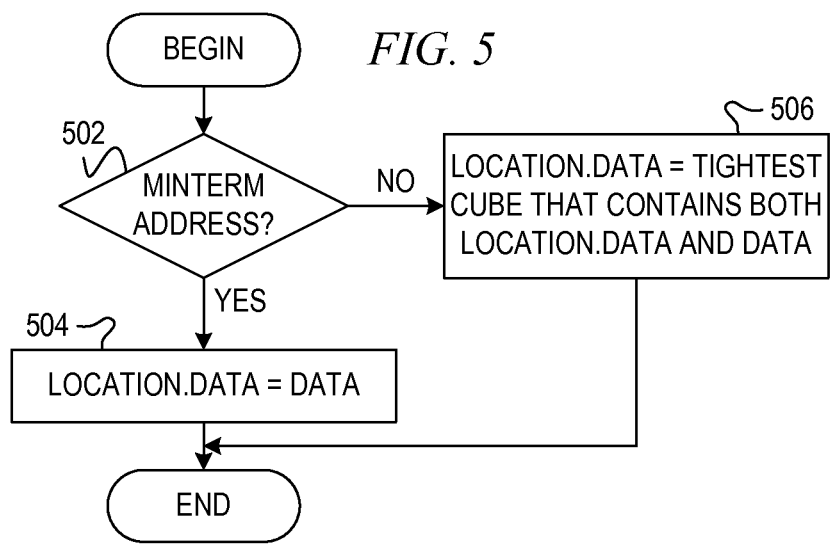
FIG. 5 is a flowchart illustrating operation of a simulator updating data at a node of the tree data structure in accordance with an illustrative embodiment.

FIG. 5 is a flowchart illustrating operation of a simulator updating data at a node of the tree data structure in accordance with an illustrative embodiment. Operation begins for a given location in the tree data structure (location) and given data being written. The simulator determines whether the address being written to is a minterm address (block 502). If the address is a minterm address, the simulator sets the data at the location (location.data) to the data being written (block 504). Thereafter, operation ends.

If the address is not a minterm address in block 502, then the simulator sets the data at the location (location.data) to the resolution of the existing location.data and the data being written, which is the tightest cube that contains both location.data and data (block 506). Thereafter, operation ends.

Figure 6:
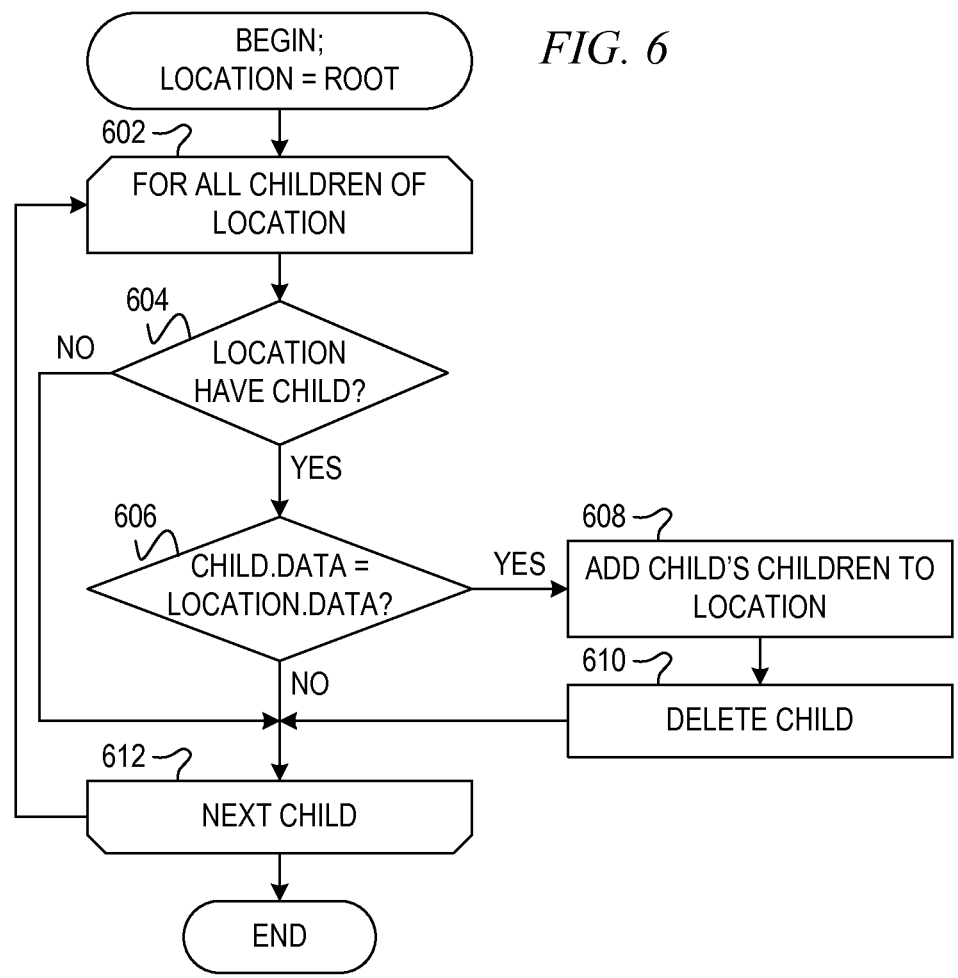
FIG. 6 is a flowchart illustrating operation of a simulator cleaning up the tree data structure in accordance with an illustrative embodiment.

FIG. 6 is a flowchart illustrating operation of a simulator cleaning up the tree data structure in accordance with an illustrative embodiment. Operation begins at the root of the tree. For all children of the current location (node) (block 602), the simulator determines whether the location has a child node (block 604). If the location has a child, the simulator determines whether the data at the child (child.data) is equal to the data at the current location (location.data) (block 606). If the data at the child is equal to the child at the current location, the simulator adds the child's children to the current location (block 608) and deletes the child node (block 610).

Thereafter, or if the data at the child is not equal to the data at the current location in block 606, or if the location does not have a child in block 604, the simulator considers the next child of the current location (block 612), and returns to block 602 to repeat the loop for the next child. Responsive to the simulator considering the last child node in block 612, operation ends.

FIGS. 7A and 7B depict example pseudo-code for the operations illustrated in FIGS. 4-6 in accordance with an illustrative embodiment.

Figure 8:
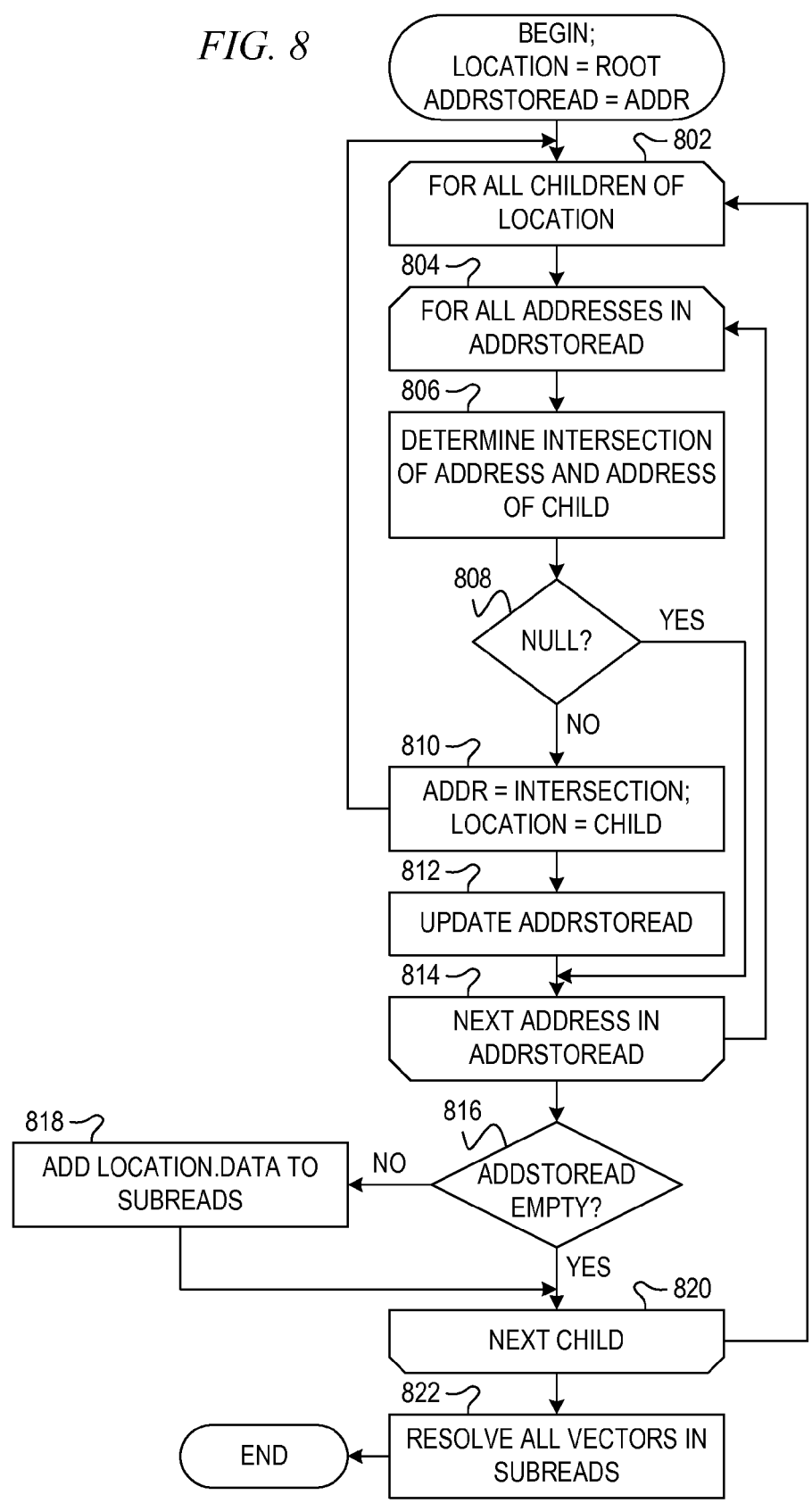
FIG. 8 is a flowchart illustrating operation of a simulation tool for performing a read from an address in accordance with an illustrative embodiment.

FIG. 8 is a flowchart illustrating operation of a simulation tool for performing a read from an address in accordance with an illustrative embodiment. Operation begins with the current location (node) in the tree equal to the root of the tree and addrstoread equal to a received address (addr). For all children of the current location (block 802) and for all given addresses in addrstoread (block 804), the simulator determines an intersection of the given address and the address of the child (block 806). Then, the simulator determines whether the intersection is null (block 808). If the intersection is null, the simulator considers the next address in addrstoread (block 814), and returns to block 804 to repeat the loop for the next address in addrstoread.

If the intersection is not null in block 808, the simulator performs the read operation recursively; therefore, the simulator sets the address (addr) to the intersection and the location to the child node (block 810), and operation proceeds to block 802. Also, the simulator updates addrstoread in a manner similar to that described above with respect to addrstoread (block 812), considers the next address in addrstoread (block 814), and returns to block 804 to repeat the loop for the next address in addrstoread.

Responsive to the simulator considering the last address in addrstoread in block 814, the simulator determines whether addrstoread is empty (block 816). If addrstoread is not empty, the simulator adds the data at the current location (location.data) to subreads (block 818). Thereafter, or if addrstoread is empty in block 816, the simulator considers the next child of the current location (block 820) and returns to block 802 to repeat the loop for the next child. Responsive to the simulator considering the last child of the current location in block 820, the simulator resolves all vectors in subreads (block 822). Thereafter, operation ends.

FIG. 9 depicts example pseudo-code for performing a read from an address in accordance with an illustrative embodiment. FIG. 10A depicts example pseudo-code for resolving values in the tree data structure in accordance with an illustrative embodiment. FIG. 10B depicts example pseudo-code for an optimized resolve implementation.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 11:
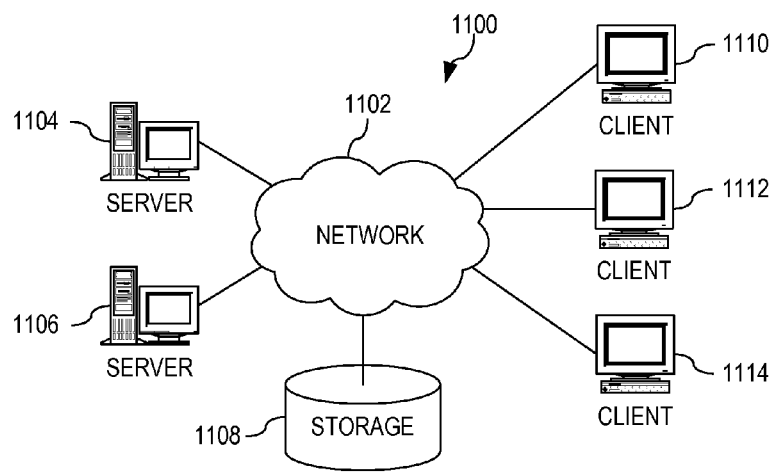
FIG. 11 depicts a pictorial representation of an example distributed data processing system in which aspects of the illustrative embodiments may be implemented.
Figure 12:
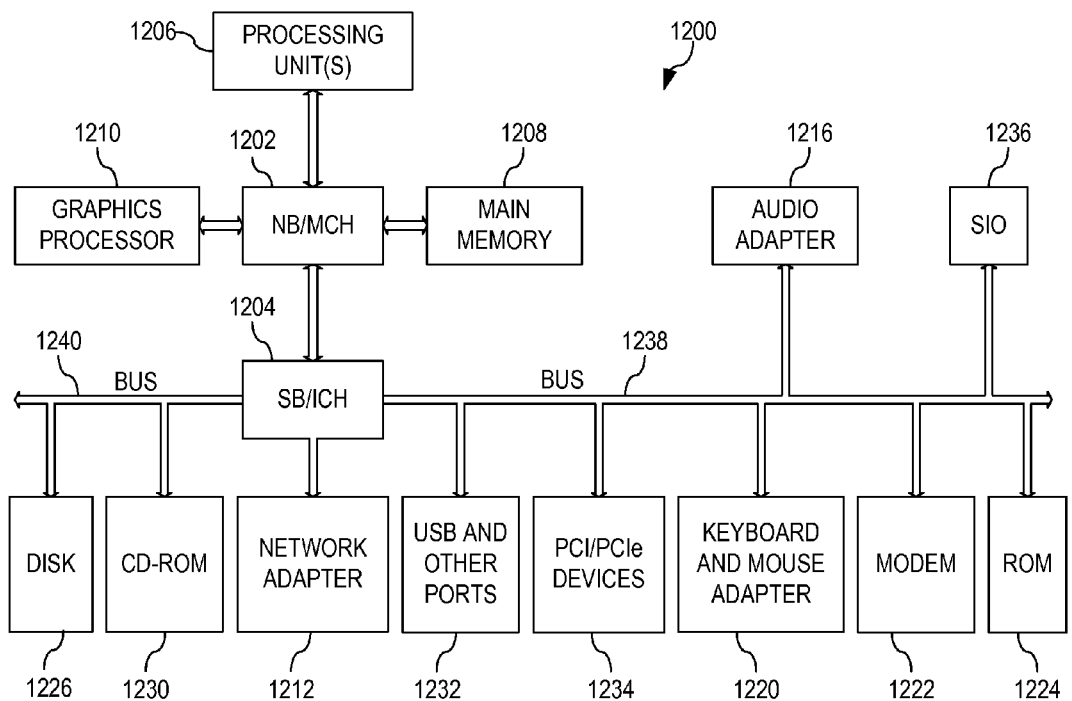
FIG. 12 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 11 and 12 are provided hereafter as example environments in which aspects of the illustrative embodiments may be implemented. While the description following FIGS. 11 and 12 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 11 and 12, example diagrams of data processing environments are provided in which illustrative embodiments of the present invention may be implemented. It should be appreciated that FIGS. 11 and 12 are only examples and are not intended to assert or imply any limitation with regard to the environments in which aspects or embodiments of the present invention may be implemented. Many modifications to the depicted environments may be made without departing from the spirit and scope of the present invention.

FIG. 11 depicts a pictorial representation of an example distributed data processing system in which aspects of the illustrative embodiments may be implemented. Distributed data processing system 1100 may include a network of computers in which aspects of the illustrative embodiments may be implemented. The distributed data processing system 1100 contains at least one network 1102, which is the medium used to provide communication links between various devices and computers connected together within distributed data processing system 1100. The network 1102 may include connections, such as wire, wireless communication links, or fiber optic cables.

In the depicted example, server 1104 and server 1106 are connected to network 1102 along with storage unit 1108. In addition, clients 1110, 1112, and 1114 are also connected to network 1102. These clients 1110, 1112, and 1114 may be, for example, personal computers, network computers, or the like. In the depicted example, server 1104 provides data, such as boot files, operating system images, and applications to the clients 1110, 1112, and 1114. Clients 1110, 1112, and 1114 are clients to server 1104 in the depicted example. Distributed data processing system 1100 may include additional servers, clients, and other devices not shown.

In the depicted example, distributed data processing system 1100 is the Internet with network 1102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 1100 may also be implemented to include a number of different types of networks, such as for example, an intranet, a local area network (LAN), a wide area network (WAN), or the like. As stated above, FIG. 11 is intended as an example, not as an architectural limitation for different embodiments of the present invention, and therefore, the particular elements shown in FIG. 11 should not be considered limiting with regard to the environments in which the illustrative embodiments of the present invention may be implemented.

With reference now to FIG. 12, a block diagram of an example data processing system is shown in which aspects of the illustrative embodiments may be implemented. Data processing system 1200 is an example of a computer, such as client 1110 in FIG. 11, in which computer usable code or instructions implementing the processes for illustrative embodiments of the present invention may be located.

In the depicted example, data processing system 1200 employs a hub architecture including north bridge and memory controller hub (NB/MCH) 1202 and south bridge and input/output (I/O) controller hub (SB/ICH) 1204. Processing unit 1206, main memory 1208, and graphics processor 1210 are connected to NB/MCH 1202. Graphics processor 1210 may be connected to NB/MCH 1202 through an accelerated graphics port (AGP).

In the depicted example, local area network (LAN) adapter 1212 connects to SB/ICH 1204. Audio adapter 1216, keyboard and mouse adapter 1220, modem 1222, read only memory (ROM) 1224, hard disk drive (HDD) 1226, CD-ROM drive 1230, universal serial bus (USB) ports and other communication ports 1232, and PCI/PCIe devices 1234 connect to SB/ICH 1204 through bus 1238 and bus 1240. PCI/PCIe devices may include, for example, Ethernet adapters, add-in cards, and PC cards for notebook computers. PCI uses a card bus controller, while PCIe does not. ROM 1224 may be, for example, a flash basic input/output system (BIOS).

HDD 1226 and CD-ROM drive 1230 connect to SB/ICH 1204 through bus 1240. HDD 1226 and CD-ROM drive 1230 may use, for example, an integrated drive electronics (IDE) or serial advanced technology attachment (SATA) interface. Super I/O (SIO) device 1236 may be connected to SB/ICH 1204.

An operating system runs on processing unit 1206. The operating system coordinates and provides control of various components within the data processing system 1200 in FIG. 12. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 1200 (Java is a trademark of Sun Microsystems, Inc. in the United States, other countries, or both).

As a server, data processing system 1200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 1200 may be a symmetric multiprocessor (SMP) system including a plurality of processors in processing unit 1206. Alternatively, a single processor system may be employed.

Instructions for the operating system, the object-oriented programming system, and applications or programs are located on storage devices, such as HDD 1226, and may be loaded into main memory 1208 for execution by processing unit 1206. The processes for illustrative embodiments of the present invention may be performed by processing unit 1206 using computer usable program code, which may be located in a memory such as, for example, main memory 1208, ROM 1224, or in one or more peripheral devices 1226 and 1230, for example.

A bus system, such as bus 1238 or bus 1240 as shown in FIG. 12, may be comprised of one or more buses. Of course, the bus system may be implemented using any type of communication fabric or architecture that provides for a transfer of data between different components or devices attached to the fabric or architecture. A communication unit, such as modem 1222 or network adapter 1212 of FIG. 12, may include one or more devices used to transmit and receive data. A memory may be, for example, main memory 1208, ROM 1224, or a cache such as found in NB/MCH 1202 in FIG. 12.

Those of ordinary skill in the art will appreciate that the hardware in FIGS. 11 and 12 may vary depending on the implementation. Other internal hardware or peripheral devices, such as flash memory, equivalent non-volatile memory, or optical disk drives and the like, may be used in addition to or in place of the hardware depicted in FIGS. 11 and 12. Also, the processes of the illustrative embodiments may be applied to a multiprocessor data processing system, other than the SMP system mentioned previously, without departing from the spirit and scope of the present invention.

Moreover, the data processing system 1200 may take the form of any of a number of different data processing systems including client computing devices, server computing devices, a tablet computer, laptop computer, telephone or other communication device, a personal digital assistant (PDA), or the like. In some illustrative examples, data processing system 1200 may be a portable computing device which is configured with flash memory to provide non-volatile memory for storing operating system files and/or user-generated data, for example. Essentially, data processing system 1200 may be any known or later developed data processing system without architectural limitation.

Returning to FIG. 1, verification tool 116 may verify operation of an integrated circuit (IC) design with one or more memory arrays. In one example embodiment, a verification program component written in the Perl programming language verifies operation of a memory array. This verification program component maintains a mapping of two-value address minterms to three-valued data and performs operations on this mapping as specified above in the description of the illustrative embodiments. Thus, read ( ) and write ( ) must perform $2^n$ operations for an address vector with n X values. For this reason, this implementation is very slow. However, the implementation is very easy to understand and may be implemented in 95 lines of Perl.

In accordance with another example embodiment, a verification program component written in the Perl programming language verifies operation of a memory array implementing the data structure of the illustrative embodiments described above. In this verification program component, each tree node is a collection of data members plus a list of child nodes. The verification program component stores each address or data vector as a string over the characters "0", "1", and "X". The verification program component implements vector operations such as resolve ( ) and intersect ( ) at the bit level. This implementation may be written in 299 lines of Perl.

In accordance with another example embodiment, a verification program component written in the C programming language verifies operation of a memory array implementing the data structure of the illustrative embodiments described above. This implementation is similar to the implementation described above and may be written in 809 lines of C. In this implementation, each tree node contains a handle to an address vector, a handle to a data vector, and a handle to the first child. Each child contains a nextPeer handle, and this allows for a node's children to be stored in a linked list while maintaining constant-sized tree nodes. The implementation stores the collection of tree nodes in its own memory manager. The tree nodes are all allocated out of a contiguous memory block and the implementation manages memory manually to maintain high utilization of this contiguous block. The implementation recycles the nextPeer data members to implement a free list. The implementation bit packs all address and data vectors. The implementation uses two bits to store every symbol ∈0,1,X with the encodings "0"=00, "1"=01, and "2"=10. This implementation makes the use of memory efficient and performs bit-parallel vector operations. FIG. 10B illustrates an optimized resolve ( ) function according to this implementation. Because all data (address) vectors are equal in length, the size of a packed data (address) vector is constant. Consequently, this implementation allocates a contiguous memory block and locates all data (address) vectors within this contiguous section. This means that comparisons on the two vectors use two closely-located memory regions and very few cache misses occur, if any. This implementation has three contiguous memory blocks: the tree nodes, the data vectors, and the address vectors. Each data (address) vector has a next handle. This allows the implementation to return a linked list of remainder vectors in intersect ( ) and to maintain a free list in the memory management code.

In accordance with an illustrative embodiment, a framework is provided to perform the same write operation on all three of the above implementations and verifies that all read operations return the same data. In one mode of operation, the framework writes random data to a random address, and for all possible three-value addresses, the verification tool confirms that the reads on this address agree. In another mode of operation, the framework writes random data to a random address, and for a random address, the verification tool confirms that the reads on this address agree. The first mode of operation finds early bugs, but is expensive when testing long address vectors. The verification tool chooses the random vectors such that "0" and "1" appear 25% of the time, on average, and "X" appears 50% of the time, on average. Using this framework, the verification tool shows that all three of the above implementations are equivalent.

In accordance with another illustrative embodiment, a framework is provided for comparing the above implementations in Perl and C using the data structure of the illustrative embodiments. The framework does twenty write operations and twenty read operations and monitors the runtime and memory usage of the implementations. For 5 address bits and 10 data bits, the Perl implementation results in maximum memory usage of 5 MB and runtime of 0.1 sec, and the C implementation results in maximum memory usage of 5 MB and 0.06 sec. For 10 address bits and 10 data bits, the Perl implementation results in maximum memory usage of 25 MB and runtime of 50.8 sec, and the C implementation results in maximum memory usage of 5 MB and runtime of 0.05 sec. For 15 address bits and 10 data bits, the Perl implementation results in maximum memory usage of greater than 41 MB and runtime of greater than 360 sec, and the C implementation results in maximum memory usage of 5 MB and runtime of 0.5 sec. As can be seen, the C implantation performs equivalent to the Perl implementation with considerable improvement in memory usage and runtime.

Thus, the illustrative embodiments provide mechanisms for tracking array data contents across three-value read and write operations while still being sound and while being efficient enough not to place unacceptable performance overhead on the simulation process. The mechanism allows one to make precise deductions about the nature of the design from the simulation patterns, deductions that would otherwise be impossible if the patterns were corrupted by lossy shortcuts. The mechanism uses a data structure and a set of algorithms that are able to track the contents of an array across a series of ternary read and write operations. These algorithms are very efficient and track the array contents with the maximum possible precision. The data structure and algorithms allow logic simulators to be very precise with minimal runtime cost.

The mechanism of the illustrative embodiments benefits electronic design simulation. The mechanism makes logic simulation much more precise. With the mechanism, one may use three-valued simulation to obtain a post-reset sequence. In addition, three-valued simulation has a substantial role in synthesis to identify redundancies and/or to obtain simulation signatures, which may be used to identify candidates for various types of reductions and invariants. As the migration toward large-block synthesis is a desirable goal to increase automation and optimality, the need to precisely interpret memory arrays becomes more critical.

There are many application domains where the mechanism of the illustrative embodiments is relevant. The first application domain is the broad simulation market. A second application domain is the formal verification market, as ternary simulation covers many binary simulations and may also be used for symbolic reasoning and many other sub-goals. A third application domain is the synthesis market, which also may serve as a front-end to simulation and formal verification, as ternary simulation may be used to identify optimization opportunities.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for tracking array data contents across three-value read and write operations in a simulation of an integrated circuit design, the method comprising:

receiving, in the data processing system, an integrated circuit design having a memory array;

initializing, by the data processing system, a tree data structure for the memory array having a root node assigning a default value to all data bits, wherein initializing the tree data structure for the memory array comprises creating the root node having a non-deterministic address having a non-deterministic value for all address bits, wherein the non-deterministic address represents a set of addresses, and a data value equal to a default value; and responsive to a write operation writing a write data value to a write address, updating, by the data processing system, the tree data structure to track memory array contents.

2. The method of claim 1, wherein the default value comprises a zero value for all data bits.

3. The method of claim 1, wherein updating the tree data structure comprises:

responsive to the write address being equal to an address of a given node, updating a data value at the given node.

4. The method of claim 3, wherein updating the data value at the given node comprises:

responsive to the write address being a minterm address, setting a data value of the given node to be equal to the write data value; and responsive to the write address not being a minterm address, resolving the data value to form a resolved data value and setting the data value of the given node to be equal to the resolved data value.

5. The method of claim 4, wherein resolving a data value comprises:

determining a tightest cube that contains the write data value and the data value of the given node.

6. The method of claim 1, wherein updating the tree data structure comprises:

responsive to the write address being a non-deterministic address having addresses represented by a non-deterministic address of a given node, creating a new child node beneath the given node, wherein an address of the new child node is equal to the addresses represented by the non-deterministic address of the given node and wherein a data value of the new child node is equal to data of the given node; and updating the data value at the new child node.

7. The method of claim 6, wherein updating the data value at the new child node comprises:

responsive to the write address being a minterm address, setting a data value of the new child node to be equal to the write data value; and responsive to the write address not being a minterm address, resolving a data value to form a resolved data value and setting the data value of the new child node to be equal to the resolved data value.

8. The method of claim 7, wherein resolving the data value comprises:

determining a tightest cube that contains the write data value and the data value of the new child node.

9. The method of claim 1, wherein updating the tree data structure comprises:

for a given node in the tree data structure and for all addresses to be written to the given node, determine an intersection of the addresses to be written and an address of each child node of the given node;

responsive to the intersection not being null for a given child node of the given node, performing a write operation to the given child node based on the intersection for the given child node and the write data value.

10. The method of claim 1, further comprising:

cleaning up the tree data structure, wherein cleaning up the tree data structure comprises:

for each given node in the tree data structure having a data value equal to a data value of a child node of the given node, adding children of the child node to the given node and deleting the child node.

11. The method of claim 1, further comprising:

responsive to a read operation reading a read data value from a read address, traversing the tree data structure to identify each node with an address that intersects the read address;

for each identified node, performing a subread to form one or more subreads; and resolving all vectors in the one or more subreads to form a read data value.

12. A computer program product comprising a computer readable storage medium having a computer readable program stored therein, wherein the computer readable program, when executed on a computing device, causes the computing device to:

receive, in the computing device, an integrated circuit design having a memory array;

initialize, by the computing device, a tree data structure for the memory array having a root node assigning a default value to all data bits, wherein initializing the tree data structure for the memory array comprises creating the root node having a non-deterministic address having a non-deterministic value for all address bits, wherein the non-deterministic address defines a set of addresses, and a data value to a default value; and responsive to a write operation writing a write data value to a write address, update, by the computing device, the tree data structure to track memory array contents.

13. The computer program product of claim 12, wherein updating the tree data structure comprises:

responsive to the write address being equal to an address of a given node, updating a data value at the given node.

14. The computer program product of claim 12, wherein updating the tree data structure comprises:

responsive to the write address being a non-deterministic address having addresses represented by a non-deterministic address of a given node, creating a new child node beneath the given node, wherein an address of the new child node is equal to the addresses represented by the non-deterministic address of the given node and wherein a data value of the new child node is equal to data of the given node; and updating the data value at the new child node.

15. The computer program product of claim 12, wherein updating the tree data structure comprises:

for a given node in the tree data structure and for all addresses to be written to the given node, determine an intersection of the addresses to be written and an address of each child node of the given node;

responsive to the intersection not being null for a given child node, performing a write operation to the given child node based on the intersection for the given child node and the write data value.

16. The computer program product of claim 12, wherein the computer readable program further causes the computing device to:

responsive to a read operation reading a read data value from a read address, traverse the tree data structure to identify each node with an address that intersects the read address;

for each identified node, perform a subread to form one or more subreads; and resolve all vectors in the one or more subreads to form a read data value.

17. The computer program product of claim 12, wherein the computer readable program is stored in a computer readable storage medium in a data processing system and wherein the computer readable program was downloaded over a network from a remote data processing system.

18. The computer program product of claim 12, wherein the computer readable program is stored in a computer readable storage medium in a server data processing system and wherein the computer readable program is downloaded over a network to a remote data processing system for use in a computer readable storage medium with the remote system.

19. An apparatus, comprising:

a processor; and a memory coupled to the processor, wherein the memory comprises instructions which, when executed by the processor, cause the processor to:

receive an integrated circuit design having a memory array;

initialize a tree data structure for the memory array having a root node assigning a default value to all data bits, wherein initializing the tree data structure for the memory array comprises creating the root node having a non-deterministic address having a non-deterministic value for all address bits, wherein the non-deterministic address defines a set of addresses, and a data value equal to a default value; and responsive to a write operation writing a write data value to a write address, update the tree data structure to track memory array contents.

* * * * *